(12) United States Patent
Krasin

(10) Patent No.: US 7,154,719 B2
(45) Date of Patent: Dec. 26, 2006

(54) CIRCUIT FOR ELECTROSTATIC DISCHARGE PROTECTION

(75) Inventor: Alexander Krasin, Moscow (RU)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/508,879

(22) PCT Filed: Mar. 22, 2002

(86) PCT No.: PCT/RU02/00113

§ 371 (c)(1),
(2), (4) Date: Jun. 13, 2005

(87) PCT Pub. No.: WO03/081742

PCT Pub. Date: Oct. 2, 2003

(65) Prior Publication Data

US 2005/0231878 A1    Oct. 20, 2005

(51) Int. Cl.
*H02H 3/20* (2006.01)
*H02H 9/04* (2006.01)

(52) U.S. Cl. .................. 361/56; 361/111; 361/91.1; 361/91.5

(58) Field of Classification Search ............... 361/111, 361/91.1, 91.5, 56
See application file for complete search history.

(56) References Cited

U.S. PATENT DOCUMENTS

| | | | |
|---|---|---|---|
| 5,222,146 A | 6/1993 | Bahl et al. | |
| 5,239,440 A | 8/1993 | Merrill | |
| 5,287,241 A * | 2/1994 | Puar | 361/56 |
| 5,323,067 A | 6/1994 | Shay | |
| 5,440,162 A | 8/1995 | Worley et al. | |
| 5,508,649 A | 4/1996 | Shay | |
| 5,559,659 A | 9/1996 | Strauss | |
| 5,731,739 A * | 3/1998 | Ho | 330/253 |
| 5,744,842 A | 4/1998 | Ker | |
| 5,825,601 A * | 10/1998 | Statz et al. | 361/56 |
| 5,907,464 A | 5/1999 | Maloney et al. | |
| 5,946,177 A | 8/1999 | Miller | |
| 5,978,192 A | 11/1999 | Young et al. | |

(Continued)

FOREIGN PATENT DOCUMENTS

EP    0697757 A1    2/1996

(Continued)

OTHER PUBLICATIONS

Ramirez-Angulo et al; "Programmable BICMOS Transconductor for Capicitor-Transconductor Filters"; 8030 Electronic Letters, 28(1992) No. 13, Stevenage, Herts., Great Britain.

(Continued)

*Primary Examiner*—Brian Sircus
*Assistant Examiner*—Zeev Kitov

(57) ABSTRACT

A circuit providing protection against electrostatic discharge (ESD) for internal elements of an Integrated Circuit (IC). In one example, a protection circuit comprises a PMOSFET resistor (R) having a gate connected to a ground rail (VSS), a drain connected to an input node (ESD_RC) of an inverter (INV), a source and a bulk of the PMOSFET resistor (R) being connected to a power rail (VDD). The circuit also comprises an NMOSFET capacitor (C1) having a gate connected to the input node (ESD_RC) of the inverter (INV), a drain, a source and a bulk of the NMOSFET capacitor (C1) being connected to the ground rail (VSS). The circuit also includes a PMOSFET capacitor (C2) having a gate connected to the input node (ESD_RC) of the inverter (INV). A drain and a source of the PMOSFET capacitor (C2) being connected to the ground rail (VSS), and a bulk of the PMOSFET capacitor (C2) is connected to the power rail (VDD).

6 Claims, 2 Drawing Sheets

U.S. PATENT DOCUMENTS

| | | | |
|---|---|---|---|
| 6,016,070 | A | 1/2000 | Uehara |
| 6,198,138 | B1 | 3/2001 | Hirota |
| 6,385,021 | B1 | 5/2002 | Takeda et al. |
| 6,392,860 | B1 | 5/2002 | Lin et al. |
| 6,400,540 | B1 | 6/2002 | Chang |
| 6,510,033 | B1 | 1/2003 | Maloney et al. |
| 6,566,715 | B1 | 5/2003 | Ker et al. |
| 6,643,109 | B1 | 11/2003 | Li et al. |
| 6,664,823 | B1 | 12/2003 | Yokoi |
| 6,667,870 | B1 * | 12/2003 | Segervall .................. 361/111 |
| 6,795,286 | B1 | 9/2004 | Maloney et al. |
| 6,903,913 | B1 | 6/2005 | Ker et al. |
| 6,912,109 | B1 * | 6/2005 | Ker et al. .................... 361/56 |
| 6,927,957 | B1 | 8/2005 | Bakulin et al. |

FOREIGN PATENT DOCUMENTS

| | | |
|---|---|---|
| EP | 0851552 A1 | 7/1998 |
| RU | 1705947 A1 | 1/1992 |
| RU | 2071161 C1 | 12/1996 |
| WO | 02/27795 A2 | 4/2002 |

OTHER PUBLICATIONS

Merrill et al; "ESD Design Methodology"; ESD Symposium 93-233, pp. 5B.5.1-5B.5.5, 1993.

Torres et al; "Modular, Portable, and Easily Simulated ESD Protection Networks for Advanced CMOS Technologies", no date.

Dabral et al; "Core Clamps for Low Voltage Technologies" ESD Symposium, pp. 3.6.1-3.6.9, no date.

Anderson et al; "Cross-Referenced ESD Protection for Power Supplies" ESD Symposium 98-86, pp. 2A.5.1-2A.5.10, 1998.

Worley et al; "Sub-Micron Chip ESD Protection Schemes Which Avoid Avalanching Junctions" ESD Symposium 95-19, pp. 1.2.1-1.2.8, no date.

* cited by examiner

CIRCUIT FOR ELECTROSTATIC DISCHARGE PROTECTION

TECHNICAL FIELD

The present invention relates to a circuit for protection against an electrostatic discharge (ESD) event. In particular the invention is applicable to protection of internal elements of integrated circuits (IC).

BACKGROUND OF THE INVENTION

Semiconductor devices, and especially integrated circuits, are very sensitive to BSD events that can cause serious degradation or damage of the IC. Solutions known in the art that protect internal elements of the IC from damage are based on circuits that shunt the ESD current between the IC power supply rails.

One of the circuits known in the art protects a power supply rail from positive ESD events referenced to a grounded power supply rail. The circuit consist of a trigger circuit, an inverter stage, and a large NMOSFET transistor. Trigger circuit is designed as a resistor-capacitor (RC) transient detector. In response to an ESD event that induces a rapid positive voltage transient on the power supply rail, trigger circuit initially holds a middle node of RC trigger circuit well below grounded power supply rail. The inverter stage then drives the gate of NMOSFET. Once turned on, NMOSFET transistor provides a low resistance shunt between the power rail and the grounded rail. NMOSFET transistor will remain conductive for a period of time, which is determined by the RC time constant of the trigger circuit. It is critical that this RC time constant is long enough to exceed the maximum expected duration of an ESD event, typically a few hundred nanoseconds, while short enough to avoid false triggering of the clamp circuit during normal ramp-up of the power rail, typically a few milliseconds. During normal operation of the IC, with a constant power supply level, NMOSFET is biased in a nonconductive state.

Since the resistor in the RC chain is NWELL resistor and the capacitor is MOS capacitor the described circuit has a number of disadvantages including the following:

huge size of the NWELL resistor,
temperature dependency of resistance of NWELL resistor, which results in false triggering of the circuit.

Attempts at replacing NWELL resistor with smaller PMOSFET have failed since they could not exclude false clamp triggering in power up conditions. Up to 0.5V (threshold of PMOSFET) on power supply rail the PMOSFET does not conduct and voltage at middle node of RC chain does not rise and the threshold of the inverter in the clamp preamplifier exceeds voltage at middle node of RC trigger circuit for time enough for false clamp triggering.

Hence, considering the above disadvantages, an improved circuit for ESD protection is needed. The new circuit should be smaller and more reliable.

SUMMARY OF THE INVENTION

There is a need for a circuit for electrostatic discharge protection, which alleviates or overcomes the problems of the prior art.

The circuit according to the invention is preferably for use in protection of integrated circuits.

A circuit providing protection against electrostatic discharge (ESD) for internal elements of an Integrated Circuit (IC) in accordance with the present invention is connected to a power rail and a ground rail and to an inverter of a clamp preamplifier. Said circuit comprises a PMOSFET resistor with a gate connected to said ground rail, a drain connected to said inverter's (INV) input node, a source and a bulk connected to said power rail. An NMOSFET capacitor of the protection circuit has a gate connected to said inverter input node, a drain, a source and a bulk connected to said ground rail. The protection circuit also comprises a PMOSFET capacitor with a gate connected to said inverter input node (ESD_RC), a drain, a source connected to said ground rail and a bulk connected to said power rail.

The advantage of the present invention is that the area occupied by ESD protection circuit is about 5 times less in comparison to the circuits known in the art. As a result of introducing small PMOSFET resistor also the capacitor can be done smaller. Furthermore, including PMOSFET resistor significantly reduces the temperature dependency of the circuit.

BRIEF DESCRIPTION OF THE DRAWINGS

The present invention will be understood and appreciated more fully from the following detailed description taken in conjunction with the drawings in which.

DETAILED DESCRIPTION OF THE PREFERRED EMBODIMENT

Figure 1:
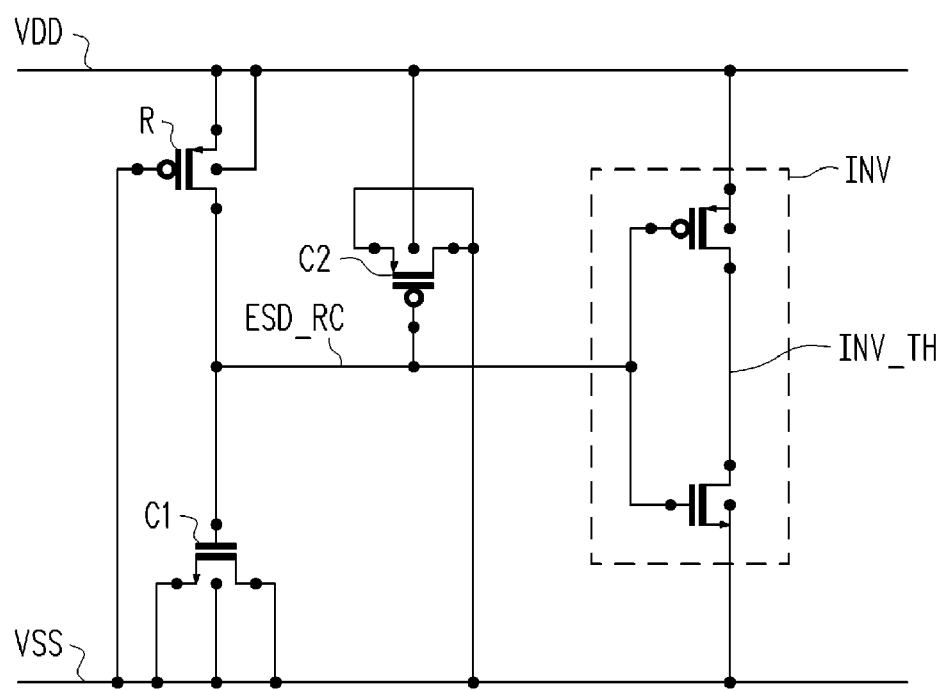
FIG. 1 is schematic diagram illustrating a circuit for protection against an ESD event in accordance with an embodiment of the invention.

Referring to FIG. 1 a circuit providing protection against electrostatic discharge (ESD) for internal elements of an Integrated Circuit (IC) according to the present invention is connected to a power rail VDD and a ground rail VSS and to an inverter INV of a clamp preamplifier. The protection circuit comprises a PMOSFET resistor R with a gate connected to said ground rail VSS, a drain connected to said inverter's INV input node ESD_RC, a source and a bulk connected to said power rail VDD. The circuit also comprises an NMOSFET capacitor C1 with a gate connected to said inverter's INV input node ESD_RC, a drain, a source and a bulk connected to said ground rail VS,L and a PMOSFET capacitor C2 with a gate connected to said inverter's INV input node ESD_RC, a drain, a source connected to said ground rail VSS and a bulk connected to said power rail VDD.

In another embodiment of the present invention the NMOSFET capacitor C1 has a non-linear characteristic.

In yet another embodiment of the present invention the PMOSFET capacitor C2 has a non-linear characteristic.

In most preferable embodiment both capacitors, C1 and C2, have non-linear characteristics.

In another embodiment of the present invention a ratio of capacitance of said PMOSFET capacitor C2 to capacitance of said NMOSFET capacitor C1 decreases when voltage at said power rail VDD exceeds NMOSFET threshold (~0.5V).

Figure 2:
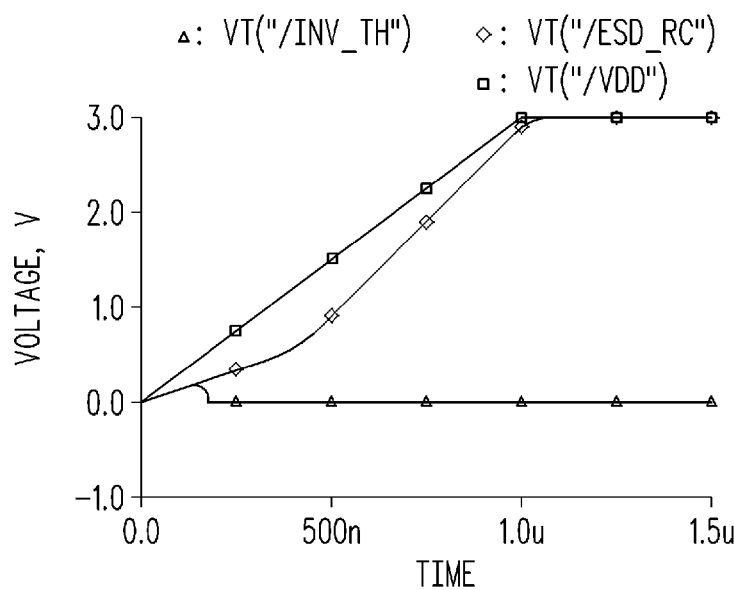
FIG. 2 illustrates transient response of the circuit in FIG. 1 for low VDD slew rate (3V/µs)

Reference is now made to FIG. 2, which depicts transient response of the circuit according to the present invention in power up conditions (VDD slew rate=3V/µs). Transient response of the RC chain at ESD_RC node begins to rise immediately with VDD rising. The PMOSFET capacitor C2 helps to charge the NMOSFET capacitor C1 and to pull up voltage at ESD_RC node over voltage at INV_TH node at the beginning of power on. This allows avoiding false clamp triggering during power up. When the ESD_RC slew rate reaches the slew rate of VDD the PMOSFET capacitor C2 does not further impact on transient response.

Figure 3:
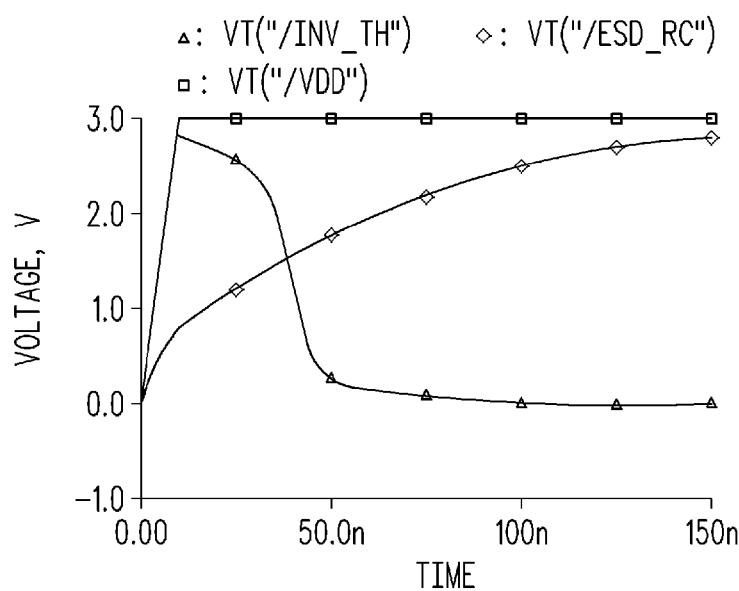
FIG. 3 illustrates transient response of the circuit in FIG. 1 for high VDD slew rate (300V/µs).

Reference is now made to FIG. 3, which illustrates transient response of the circuit according to the present invention during an ESD event (VDD slew rate=300 V/µs). Transient response of the RC chain at ESD_RC node begins to rise slower then VDD voltage and the voltage at INV_TH node exceeds ESD_RC voltage causing correct clamp triggering.

The circuit in accordance with the invention may be used in various electronic devices, in particular it can be an integral part of integrated circuits.

It will be understood that the invention tends to provide the following advantages singly or in any combination:
- significant reduction of space required for the resistor and capacitor in RC chain and in consequence for the circuit,
- less temperature dependency of the circuit due to excluding NWELL resistor,
- increased reliability caused by elimination of false triggering during power up.

The invention claimed is:

1. A circuit providing protection against electrostatic discharge (ESD) for internal elements of an Integrated Circuit (IC), the circuit being connected to a power rail and a ground rail and to an inverter of a clamp preamplifier, said circuit comprises:
   a PMOSFET resistor with a gate connected to said ground rail, a drain connected to an input node of said inverter, a source and a bulk connected to said power rail,
   an NMOSFET capacitor having a gate connected to said input node of said inverter, a drain, a source and a bulk of said NMOSFET capacitor being connected to said ground rail, and
   a PMOSFET capacitor having a gate connected to said input node of said inverter, a drain and a source of said PMOSFET capacitor being connected to said ground rail, and a bulk of said PMOSFET capacitor being connected to said power rail.

2. The circuit according to claim 1 wherein said NMOSFET capacitor has a non-linear capacitance characteristic.

3. The circuit according to claim 1 wherein said PMOSFET capacitor has a non-linear capacitance characteristic.

4. The circuit according to claim 1 wherein said NMOSFET capacitor and said PMOSFET capacitor have non-linear capacitance characteristics.

5. The circuit according to any of the claim 1 wherein ratio of capacitance of said PMOSFET capacitor to capacitance of said NMOSFET capacitor decreases when voltage at said power rail exceeds NMOSFET threshold.

6. An integrated circuit comprising a circuit providing protection against an electrostatic discharge event, the circuit providing protection being connected to a power rail and a ground rail and to an inverter of a clamp preamplifier, said circuit comprises:
   a PMOSFET resistor with a gate connected to said ground rail, a drain connected to an input node of said inventor, a source and a bulk connected to said power rail,
   an NMOSFET capacitor having a gate connected to said input node of said inverter, a drain, a source and a bulk of said NMOSFET capacitor being connected to said ground rail, and
   a PMOSFET capacitor having a gate connected to said input node of said inverter, a drain and a source of said PMOSFET capacitor being connected to said ground rail, and a bulk of said PMOSFET capacitor being connected to said power rail.

* * * * *